United States Patent [19]
Bergmann et al.

[11] Patent Number: 4,992,153
[45] Date of Patent: Feb. 12, 1991

[54] SPUTTER-CVD PROCESS FOR AT LEAST PARTIALLY COATING A WORKPIECE

[75] Inventors: Erich Bergmann, Mels, Switzerland; Franz Gassner, Triesenberg, Liechtenstein

[73] Assignee: Balzers Aktiengesellschaft, Balzers Furstentum, Liechtenstein

[21] Appl. No.: 379,214

[22] Filed: Jul. 13, 1989

[30] Foreign Application Priority Data

Apr. 26, 1989 [CH] Switzerland ............................ 1586/89

[51] Int. Cl.$^5$ ........................ C23C 14/34; C23C 14/30
[52] U.S. Cl. ........................ 204/192.160; 204/192.12; 204/192.15; 204/192.31; 204/298.05; 204/298.26
[58] Field of Search ................ 204/192.12, 192.15, 204/192.16, 192.25, 192.26, 192.31, 298.26

[56] References Cited

U.S. PATENT DOCUMENTS

| | | | |
|---|---|---|---|
| 3,964,986 | 6/1976 | Mark | 204/192.26 |
| 4,419,202 | 12/1983 | Gibson | 204/192.16 |
| 4,842,710 | 6/1989 | Freller et al. | 204/192.38 |
| 4,871,434 | 10/1989 | Münz et al. | 204/192.16 |

FOREIGN PATENT DOCUMENTS 664768  10/1985  Switzerland ..................... 118/723

OTHER PUBLICATIONS

"Reactivity Sputter-Deposited High Emissivity", etc., J. Vac. Sci. Technol., 18 (2), Mar. 1981, pp. 223 to 225, by E. L. Foster and G. H. Stickford.
"Thin Film Process", Academic Press, 1978, pp. 56 and 57, by J. L. Vossen and J. J. Cuomo.

Primary Examiner—Aaron Weisstuch
Attorney, Agent, or Firm—Notaro & Michalos

[57] ABSTRACT

A workpiece surface is provided with a layer which is applied by a sputter-CVD process. An optimum hardness and sliding quality of the layer is obtained at a positive bias of the workpiece surface relative to the plasma. For tungsten carbide/carbon layer, an optimum layer quality is attainable at a bias of thirty-five volts. Besides tungsten carbide/carbon layers, also silicide/silicon layers can be produced if volatile silicon compounds are used as the reactive gas.

16 Claims, 1 Drawing Sheet

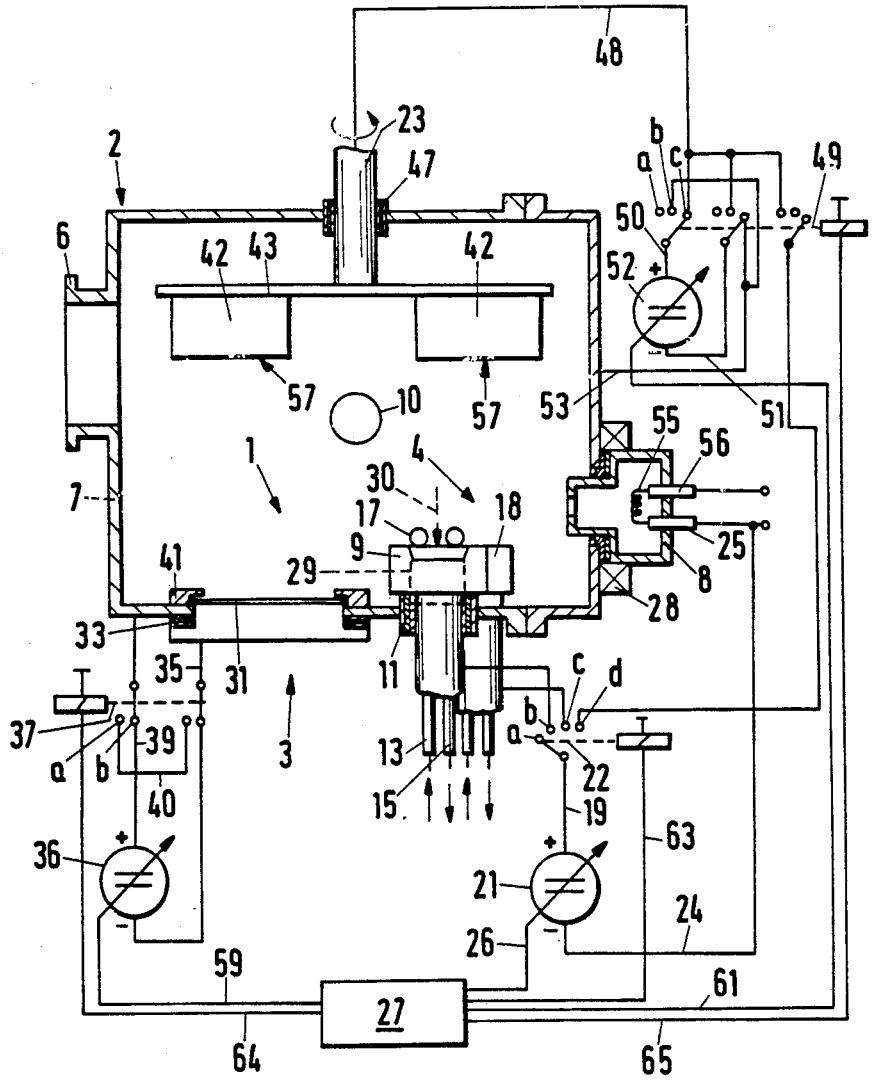

United States Patent Office

PTO - BOYERS, PA Duty Station

MISSING PAGE TEMPORARY NOTICE

PATENT # 4992,153   FOR ISSUE DATE 2-12-91

HAS BEEN SCANNED, BUT WITH MISSING PAGE(S). UPON RECEIVING OF MISSING PAGE(S), THE ENTIRE DOCUMENT WILL RE RESCANNED. PLEASE CALL IMAGE DATA ADMINISTRATION STAFF OF 557-6154 IF YOU HAVE A QUESTION. ASK FOR DAVE GROOMS, ANITA YOUNG OR POLA JONES.

THIS NOTICE IS FOR THE MISSING PAGE CONTAINING:

DRAWING SHEET #   1

Data Conversion Operation
Boyers, Pa

SPUTTER-CVD PROCESS FOR AT LEAST PARTIALLY COATING A WORKPIECE

FIELD AND BACKGROUND OF THE INVENTION

The present invention relates to a process for at least partially coating workpieces using a sputter-CVD process, and to the workpiece which is coated by the process.

A process of this kind has been described by C. E. Wickersham, E. L. Foster and G. H. Stickford in "Reactively Sputter-Deposited High-Emissivity Tungsten Carbide/Carbon Coatings", *J. Vac. Sci., Technol.*, 18 (2), March 1981, p. 223 to 225. There a workpiece was coated with a tungsten carbide/carbon layer. The cathode sputtering operated with a frequency of 13.56 MHz at a power of 500 W and a negative bias on the target. Acetylene is used as the reactive gas. This is a type of chemical vapor deposition or CVD process.

The process of the above-mentioned kind (sputter-CVD) must be distinguished firstly from other plasma-assisted chemical vapor on (CVD) processes, in which the chemical reactants of the substance forming the layer are introduced into the vacuum chamber in gaseous form and are activated and partially ionized in the space before the workpiece surfaces to be coated by an electric gas discharge (low-voltage arc) (Swiss Pat. No. CH-PS 664,768), the workpieces being connected to a voltage which is negative as compared with the vacuum chamber and the arc plasma In contrast to the initially mentioned process, cathode sputtering does not take place here.

Secondly, the sputter-CVD process of the kind in question must be distinguished from Physical Vapor Deposition (PVD), where the substances are applied to the workpiece surface without chemical reaction, and only by condensation of vapor. The vapor can be produced by cathode sputtering, see for instance J. L. Vossen, J. J. Cuomo, in "Thin Film Processes", *Academic Press*, 1978, p. 56 and 57. As described there, one operates either with DC voltage or a high-frequency glow discharge, and the workpieces are connected to a negative bias voltage. A positive bias should be avoided as Vossen et al. state, for several reasons, mainly for the reason that a strong electron flow onto the workpieces occurs, with the result of intense substrate heating and very irregular current distribution.

The known sputter-CVD process thus is indeed advantageous as compared with the other mentioned processes, with respect to the layer composition and layer properties. But the excitation of the gas by a high-frequency voltage results in high machine investments as compared with a system operating with DC voltage because of the necessary high-power HF generators, which must be shielded in accordance with legal regulations. Further, it is difficult to introduce the high frequency into the vacuum coating chamber without great losses, especially if the parts to be coated are held by rotating supports during the coating operation.

SUMMARY OF THE INVENTION

It is an object of the present invention to provide a process of the initially mentioned kind, which is easy to carry out, and in which layers are applied on a workpiece surface by a sputter-CVD process which has a high hardness and a high three-body abrasion resistance.

Accordingly, another object of the present invention is to provide a method for at least partially coating a workpiece using a sputter-CVD process operating in a vacuum chamber where at least one material acting as a cathode is sputtered and at least one component of a gas is decomposed and precipitated by plasma-chemical reaction in the chamber, the sputtering being accomplished using a DC voltage applied between the material of the cathode and an anode, and with a surface of the workpiece to be coated being maintained at a DC voltage potential which is more positive than the plasma or more positive than the anode.

Another object of the present invention is to provide a workpiece which is coated in accordance with the process of the present invention.

The advantages achieved by the present invention are seen essentially in that the process is a simple, cost-effective sputter-CVD process that can be carried out without the use of high-frequency (and therefore without official approval procedures and without special safety measures for the HF operation), with which layers of high hardness and a high three-component abrasion resistance are obtained.

The various features of novelty which characterize the invention are pointed out with particularity in the claims annexed to and forming a part of this disclosure. For a better understanding of the invention, its operating advantages and specific objects attained by its uses, reference is made to the accompanying drawing and descriptive matter in which a preferred embodiment of the invention is illustrated.

BRIEF DESCRIPTION OF THE DRAWING

The single figure illustrates equipment which can be used to carry out the process of the present invention and manufacture the workpiece of the present invention.

DESCRIPTION OF THE PREFERRED EMBODIMENT

Referring to the figure, an example of equipment for carrying out the process of the invention comprises a floor 1 of a vacuum coating chamber 2 which carries a side-by-side arrangement including a device 3 for magnetic field-assisted sputtering and a device 4 for ion-plating. Several such devices 3 and/or 4 may be provided in a single chamber 2.

The vacuum coating chamber is formed as a rectangular chamber 2, which can be evacuated via a pump station (not shown), which is connectable to a flange 6 of chamber 2. An ionization chamber 8 for a so-called low-voltage arc discharge, is connected by flange to the wall 7 of chamber 2. The back wall of the chamber has a gas inlet 10 therethrough. An evaporation crucible 9 in chamber 2 serves as an anode for the low-voltage arc discharge for ion-plating. The crucible 9 is electrically isolated from chamber 2 by an insulation sleeve 11 made of insulating material, and is cooled by means of a heat exchanger having a cooling water inlet 13 and outlet 15. The evaporation crucible 9 contains an evaporable material 17. A cooled copper plate 18 acting as an auxiliary anode, has a heat exchanger that is analogous to the heat exchanger of the evaporation crucible 9, and is located in the drawing behind the evaporation crucible 9. The positive pole 19 of an arc discharge supply unit 21 is electrically connectable via a switch 22, either to the evaporation crucible 9 (switch position b), the auxiliary anode 18 (switch position c) or a pivot 23 described below (switch position d) via a switch 49 (switch position of switch 49). Through switch 22, the positive pole 19 of supply unit 21 can be cut off completely in a switch position a. The negative pole 24 of the arc discharge supply unit 21 is connected to an electrode 25 in the ionization chamber 8. The voltage and suppliable current of the arc discharge unit 21 are adjustable and are set by a control unit 27 via a control line 26. The magnetic field of one or more coils 28 (represented schematically), is used for focussing and guiding the low-voltage arc. The technology of material evaporation, as well as the guiding and focussing of the low-voltage arc are state-of-the art and can be learned from pertinent literature In the figure a so-called remote-focus electron source 29 is disposed between the evaporation crucible 9 at the bottom 1, and the auxiliary anode 18. By a magnetic field (not shown), whose lines of force run essentially perpendicular to the drawing plane, an electron beam 30 of source 29 can be guided onto the material 17 to be evaporated. On their path from source 29 to the material 17 the electrons are deflected by 180° and simultaneously focussed.

In the figure, at the left next to the evaporation crucible 9, at the bottom 1, the device 3 for magnetic field-supported sputtering is disposed, as has been mentioned before. It is provided with a heat exchanger (not shown) for cooling. The required magnet system is also not shown, in order not to crowd the figure. The appearance and position of the required magnet system can likewise be seen from the pertinent literature. On the inside of chamber 2, the device 3 has a target 31 of tungsten carbide acting as cathode, which is atomized during sputtering. The target 31 is electrically insulated from the wall 7 of chamber 2 by an insulating ring 33 and is connected to the negative pole 35 of a voltage source 36 via a two-pole changeover switch 37. The positive pole 39 of the voltage source 36 is electrically connected via the other branch of the changeover switch 37 to the wall 7 of chamber 2, which is conductively connected to an anode 41 spaced from the edge of the target 31. The changeover switch 37 has two positions, the one just described being marked b and another one, a, in which the target 31 is connectable to wall 7 and hence to the anode 41 via an electric shortcircuit 40. The plasma of the discharge is limited during sputtering by the anode 41.

Two of several (e.g. seven) workpieces 42 to be coated are shown in the drawing and are secured on a turntable 43 in the chamber 2. The turntable 43 is secured electroconductively on the pivot 23, which is mounted to and insulated from the wall 7 by a spacer 47 and can be rotated by a drive (not shown). The pivot 23 and hence also the workpieces 42 are connectable by a line 48 via the switch 49 either to the positive pole 50 or to the negative pole 51 of a voltage source 52, as well as to the positive pole 19 (via switch 22 in position d) of the arc discharge supply unit 21. Through switch 49, the voltage source 52 is electroconductively connectable both by its positive pole 50 (switch position b) and by its negative pole 51 (switch position c) to the wall 7 via a line 53. The potential of wall 7 is zero volts if not connected to a voltage source.

In the ionization chamber 8, a spiral 55 of a suitable refractory alloy, e.g. tungsten or tantalum, connects the electrode 25 with another electrode 56 which is insulated from the wall of the ionization chamber 8 and from the electrode 25. A power supply unit for current supply to spiral 55 is not shown.

The surface of the workpieces 42 facing toward the devices 3 and 4 for sputtering and ion-plating is marked 57. The distance of the workpiece surfaces 57 to be coated from the evaporation crucible 9 is selected so that the electric ionization caused between the crucible and the spiral 55 or respectively the electrode 25, has dropped to below 20% as compared to the ionization of the arc core.

The voltage, or respectively the current, to be supplied by the voltage sources 36 and 52, is adjustable and controllable by the control unit 27 through respective control lines 59 and 61. The switches 22, 37 and 49 can be switched by respective control lines 63, 64 and 65 from the control unit 27. The switch position can also be checked by the control unit 27.

The switches 22, 37 and 49 illustrated in the drawing are in the switch position which they have in the last process step for applying a tungsten carbide/carbon layer onto surfaces 57 of workpieces 42.

For coating, the workpieces 42 are conductively attached to the turntable 43, and the chamber 2 is filled with argon from a gas inlet device (not shown) and over the gas inlet 10. The changeover switch 37 is in its switch position a so that the target 31 is electroconductively connected to the wall 7. To heat up the workpieces 42, a low-voltage arc burns from spiral 55 to the surfaces 57 of the workpieces 42. For this, the switch 49 is in its position a and switch 22 is in its position d, whereby the positive pole 19 of the voltage source 21 is connected to the workpieces 42.

After sufficient heating of the workpiece surfaces 57, switch 22 is switched to its position c, whereby the positive pole 19 of voltage source 21 is connected to the auxiliary anode 18, in order for the low-voltage arc to burn between the auxiliary anode 18 and spiral 55. At the same time the current of the low-voltage arc is reduced by the control unit 27 by a signal over the control line 26 to the voltage source 21. Switch 49 is brought into its position b by the control unit 27 via the control line 65. Through this switching process the workpieces 42 are connected to the negative pole 51 of the voltage source 52. Wall 7 is connected to the positive pole 50 of the voltage source 52. Due to the negative potential of the workpiece surfaces 57, argon ions produced by the low-voltage arc are attracted by the workpiece surfaces 57 and due to their kinetic energy knock out material lying at the surface 57 This knocking out results in a cleaning effect of the surface 57.

The surface having been cleaned sufficiently, switch 22 is brought into its position b, in which the positive pole 19 of the voltage source 21 is connected to the evaporation crucible 9. Due to this switching, the low-voltage arc now burns between electrode 25 or spiral 55 and the evaporation crucible 9. Titanium is used as material 17 to be evaporated. Simultaneously with the switching of the low-voltage arc, the electron source 29 is switched on and its electron beam 30 is guided and focussed onto the titanium 17 by means of the deflecting and focussing magnets (not shown). The current of the low-voltage arc is adjusted to approximately 110 amperes The electrons of the electron beam 30 are accelerated with 6 to 10 kV, the maximum power being 14 kW. As a result of the power density attained with the focussed electron beam 30 upon impingement of the electrons on the titanium 17 contained in the evaporation crucible 9, the titanium is locally heated very strongly, so that a high evaporation rate results. The vapor is ionized by the low-voltage arc. The evaporated and ionized titanium precipitates on the workpieces surfaces 57 as a so-called adhesion layer for further layers to be applied (so-called ion-plating process). For uniform deposition, the turntable 43 revolves at a rate of about three revolutions per minute.

After the applied layer has reached a thickness of 0.1 to 0.2 micrometers, the shortcircuit 40, which connects the sputter apparatus 3 to the wall 7, is abolished by the changeover switch 37 in that the switch 37 is switched by the control unit 27 via the control line 64 to its position b. Thereby the negative pole 35 of voltage source 36 is connected to the tungsten carbide target 31. The sputtering process is set in motion. The voltage and current of the voltage source 36 are adjusted and checked by the control unit 27 through control line 59. Approximately simultaneously with the changeover of switch 37, switch 49 is brought into its position a. Hence neither a positive not a negative voltage is applied to the workpieces 42. The voltage of the workpieces is thus allowed to "float" Tungsten and tungsten carbide are sputtered off the target 31 and from the acetylene now supplied to chamber 2, carbon is separated by means of a plasma-chemical reaction. There results on the workpiece surface 57 a mixed layer of titanium evaporated by means of the electron beam 30 and ionized by the low-voltage arc, as ion-plating, jointly with the sputtered tungsten carbide/carbon, carbon being produced from the acetylene gas by a plasma-chemical reaction, which, combining with the tungsten to carbide, likewise precipitates on the workpiece 42 along with titanium and carbon. For the deposition to occur uniformly, the turntable 43 with the workpieces 42 rotates at a speed of about twelve revolutions per minute.

When the mixed layer thickness is some ten nanometers, the electron beam 30 and the low-voltage arc are turned off. The positive pole 50 of the voltage source 52 is connected via switch 49 (position c) to the workpieces 42 via line 48 and the negative pole 51 to the wall 7. Switch 22 is set in position d, whereby the low-voltage arc is extinguished. The voltage for the workpieces 42 is adjusted via the control line 61 of the control unit 27 by the voltage source 52 to 30 volts. Through the gas inlet device (not shown), via the gas inlet 10, acetylene as reactive gas for a plasma-chemical reaction is admitted at a gas flow of about 350 standard cubic centimeters per minute for seven workpieces 42 to be coated. The exact flow depends on the number of workpieces 42 and their surface dimensions to be coated. The gas pressure of the acetylene in chamber 2 is about 1 Pa. Tungsten and tungsten carbide from the sputter target 31, as well as carbon which is released by the plasma-chemical reaction from the acetylene and partially combines with the tungsten to tungsten carbide, precipitate on the workpiece surfaces 57. Sputtering is carried out until a layer of tungsten carbide/carbon of several micrometers thickness is reached.

It has been found, surprisingly, that without using high-frequency in the sputtering by means of DC voltage cathode sputtering, at which the workpieces 42 to be coated are connected to a positive voltage, very well attached tungsten carbide/carbon layers of high hardness and having a high three-body abrasion resistance can be produced. Optimum layer quality is achieved with a positive bias of approximately 35 volts. At this voltage the current in line 48 to the workpieces is higher by approximately 20% than the current in line 35 to the target 31.

Advantageously, the workpiece surfaces are maintained at a DC voltage potential which is more positive than the plasma by 25 to 45 volts. Alternatively, the workpiece surfaces should be maintained at a DC voltage potential which is more positive than the anode by 20 to 40 volts. A current of least 50% of the current flowing through the cathode lead 35 to the target material 31 to be sputtered, should be supplied to the workpieces 42. The current supplied to the workpieces can be adjusted to a value between 1 and 1.5 times the current in the cathode lead, and advantageously 1.2 times the current in the cathode lead.

Instead of tungsten (tungsten/tungsten carbide) as the material to be sputtered, also boron, carbon, silicon, metals of the chemical groups IVb, Vb, VIb, VIII, or their alloys with a substantial proportion of these elements, or compounds of these elements with one another or metalloids of the groups IVa, Va, VIa can be used as the cathode material.

The layers produced by the above process possess 50 to 99 atom percent free carbon and a balance containing essentially carbides of the elements boron, silicon or of the elements of the groups IVb, Vb, VIII or their mixtures.

Instead of acetylene as the carbon-dissociating gas, other gasses possessing an essential hydrocarbon component can be used. Also it is possible to use, instead of carbon-yielding gases or gas mixtures, gases or gas mixtures with volatile silicon compounds for the production of silicide/silicon layers.

Instead of the low-voltage arc burning toward the evaporation crucible 9, two electrodes between which a low-voltage arc burns for the ionization of the material evaporated from the crucible may be disposed in a horizontal plane below the turntable 43.

The layer may also be composed of several layer strata of different material. Also, one of the layer strata may be applied in reactive, and one of the others in non-reactive atmospheres.

For certain workpiece materials, as for example titanium alloys and certain steels, the adhesion and mixed layers may be dispensed with. In that case there is no need in chamber 2 for the evaporation crucible 9, the auxiliary anode 18, the ionization chamber 8 and the remote-focus electron source 29, or for the arc discharge supply unit 21. The cleaning of the workpiece surfaces 57 can then be carried out, as is known from the state of the art, by a process other than the one described.

While a specific embodiment of the invention has been shown and described in detail to illustrate the application of the principles of the invention, it will be understood that the invention may be embodied otherwise without departing from such principles.

What is claimed:

1. A process for at least partially coating a workpiece by sputter chemical vapor deposition in a vacuum chamber, comprising:

sputtering one cathode material which forms a cathode that is operated in conjunction with an anode, by applying a DC voltage between the cathode material and the anode;

supplying a reactive gas to the vaccum chamber, said reactive gas having a component selected from at least one of a group including a hydrocarbon compound and a volatile silicon compound, the component being capable of reacting in a plasma-chemical reaction with the cathode material and of precipitating onto the workpiece a precipitate selected from the group including at least one of carbon and silicon, with at least one of a reaction product of carbon with the cathode material, and a reaction product of silicon with the cathode material;

establishing a plasma in the vacuum chamber for decomposing said component and precipitating the precipitate;

maintaining the surface of the workpiece to be coated at a DC voltage which is more positive than that of the plasma; and supplying current to the workpiece and to the cathode material, the current supplied to the workpiece being maintained at a level of at least 50% of the current being supplied to the cathode material so that an electrical conductive layer of the precipitate containing free carbon or silicon and the reaction product of carbon or silicon with the cathode material is deposited onto the surface of the workpiece to be coated by a sputter chemical vapor deposition process without the use of high frequency power.

2. A process according to claim 1, including maintaining the workpiece surface at a DC potential which is more positive than that of the plasma by 25 to 45 volts.

3. A process according to claim 1, wherein the current being supplied to the workpiece is from 1 to 1.5 times the current being supplied to the cathode material.

4. A process according to claim 3, wherein the current being supplied to the workpiece is 1.2 times the current being supplied to the cathode material.

5. A process according to claim 1, wherein the cathode material comprises one of boron, carbon, silicon, group IVb metals, group Vb metals, group VIb metals, group VIII metals, alloys thereof, and compounds thereof with at least one of metalloids of group Iva, group Va, and group VIa.

6. A process according to claim 1, wherein the reaction product of carbon or silicon with the cathode material is a carbide or silicide, respectively.

7. A process for at least partially coating a workpiece by sputter chemical vapor deposition in a vacuum chamber, comprising;

sputtering one cathode material which forms a cathode that is operated in conjunction with an anode, by applying a DC voltage between the cathode material and the anode;

supplying a reactive gas to the vacuum chamber, said reactive gas having a component selected from at least one of a group including a hydrocarbon compound and a volatile silicon compound, the component being capable of reacting in a plasma-chemical reaction with the cathode material and of precipitating onto the workpiece a precipitate selected from the group including at least one of carbon and silicon, with at least one of a reaction product of carbon with the cathode material, and a reaction product of silicon with the cathode material;

establishing a plasma in the vacuum chamber for decomposing said component and precipitating the precipitate;

maintaining the surface of the workpiece to be coated at a DC voltage potential which is more positive than that of the anode; and supplying current to the workpiece and to the cathode material, the current supplied to the workpiece being maintained at a level of at least 50% of the current being supplied to the cathode material so that an electrical conductive layer of the precipitate containing free carbon or silicon and the reaction product of carbon or silicon with the cathode material is deposited onto the surface of the workpiece to be coated by a sputter chemical vapor deposition process without the use of high frequency power.

8. A process according to claim 7, including maintaining the workpiece surface at a DC potential which is more positive than that of the anode by 20 to 40 volts.

9. A process according to claim 7, wherein the current being supplied to the workpiece is from 1 to 1.5 times the current being supplied to the cathode material.

10. A process according to claim 9, wherein the current being supplied to the workpiece is 1.2 times the current being supplied to the cathode material.

11. A process according to claim 7, wherein the cathode material comprises one of boron, carbon, silicon, group IVb metals, group Vb metals, group VIb metals, group VIII metals, alloys thereof, and compounds thereof with at least one of metalloids of group IVa, group Va, and group VIa.

12. A process according to claim 7, wherein the reaction product of carbon or silicon with the cathode material is a carbide or silicide, respectively.

13. A process for coating at least one surface of a workpiece in a vacuum chamber, comprising:

supplying an ionizable neutral gas to the vacuum chamber;

applying a negative potential to the workpiece surface with respect to the vacuum chamber;

directing an electron beam toward a material held in an evaporation crucible in the vacuum chamber, for evaporating the material;

establishing a low voltage arc in the vacuum chamber for ionizing the evaporated material and precipitating the evaporated material onto the workpiece surface in an ion-plated layer.

after precipitating the ion-plated layer, removing the negative potential from the workpiece surface for allowing the workpiece surface to have a floating voltage;

applying a DC voltage between a cathode material and an anode in the vacuum chamber for sputtering the cathode material;

supplying a reactive gas having at least one component capable of reacting and precipitating in a plasma-chemical reaction, to the vacuum chamber;

establishing a plasma in the vacuum chamber for decomposing and precipitating the component from the reactive gas in a plasma-chemical reaction; and maintaining the surface of the workpiece to be coated with the sputtered reacted cathode material, at a DC voltage potential which is more positive than that of the plasma, whereby a layer is deposited onto the surface of the workpiece to be coated by a sputter chemical vapor deposition process, without the use of high frequency power.

14. A process according to claim 13, wherein the ionizable neutral gas comprises argon and the evaporated material comprises titanium, the negative potential being applied to the workpiece surface long enough to form the ion plated layer with a thickness from 0.1 to 0.2 micrometers.

15. A process for coating at least one surface of a workpiece in a vacuum chamber, comprising:
supplying an ionizable neutral gas to the vacuum chamber;
applying a negative potential to the workpiece surface with respect to the vacuum chamber;
directing an electron beam toward a material held in an evaporation crucible in the vacuum chamber, for evaporating the material;
establishing a low voltage arc in the vacuum chamber for ionizing the evaporated material and precipitating the evaporated material onto the workpiece surface in an ion-plated layer;
after precipitating the ion-plated layer, removing the negative potential from the workpiece surface for allowing the workpiece surface to have a floating voltage;
applying a DC voltage between a cathode material and an anode in the vacuum chamber for sputtering the cathode material;
supplying a reactive gas having at least one component capable of reacting and precipitating in a plasma-chemical reaction, to the vacuum chamber;
establishing a plasma in the vacuum chamber for decomposing and precipitating the component from the reactive gas in a plasma-chemical reaction; and
maintaining the surface of the workpiece to be coated at a DC voltage potential which is more positive than that being applied to the anode, sputtering of the cathode material being further accomplished by applying a DC voltage between the cathode material and the workpiece, whereby a layer is deposited on the surface of the workpiece using a sputtering chemical vapor deposition process without the use of high frequency power.

16. A process according to claim 15, wherein the ionizable neutral gas comprises argon and the evaporated material comprises titanium, the negative potential being applied to the workpiece surface long enough to form the ion plated layer with a thickness from 0.1 to 0.2 micrometers.

* * * * *